US008242588B2

(12) United States Patent
Mosher et al.

(10) Patent No.: US 8,242,588 B2
(45) Date of Patent: Aug. 14, 2012

(54) LEAD FRAME BASED CERAMIC AIR CAVITY PACKAGE

(75) Inventors: Christopher E. Mosher, Newbury, MA (US); Ronald H. Schmidt, Middleboro, MA (US)

(73) Assignees: Barry Industries, Inc., Attleboro, MA (US); Semiconductor Enclosures, Inc., Newburyport, MA (US)

( * ) Notice: Subject to any disclaimer, the term of this patent is extended or adjusted under 35 U.S.C. 154(b) by 154 days.

(21) Appl. No.: 12/838,830

(22) Filed: Jul. 19, 2010

(65) Prior Publication Data

US 2011/0012242 A1    Jan. 20, 2011

Related U.S. Application Data

(60) Provisional application No. 61/226,413, filed on Jul. 17, 2009.

(51) Int. Cl.
*H01L 23/52* (2006.01)

(52) U.S. Cl. ........ 257/676; 257/690; 257/691; 257/700; 257/E23.031

(58) Field of Classification Search .................. 257/676, 257/700, 690–691
See application file for complete search history.

(56) References Cited

U.S. PATENT DOCUMENTS

| 4,551,747 | A | * | 11/1985 | Gilbert et al. | ................ 257/691 |
| 5,331,511 | A | * | 7/1994 | Lee et al. | ...................... 361/713 |

* cited by examiner

*Primary Examiner* — Thanh Nguyen
(74) *Attorney, Agent, or Firm* — Weingarten, Schurgin, Gagnebin & Lebovici LLP

(57) ABSTRACT

A ceramic semiconductor package provides for being surface mounted on a printed circuit board or other mounting surface. A ceramic frame is directly attached to a lead frame to define a cavity in which the base of a semiconductor device is mounted to the portion of the lead frame exposed at the bottom of the cavity. Interface terminals of the semiconductor device are attached to electrical contacts on the ceramic frame inside the cavity. The ceramic package provides a hermetic insulated path through which the signals can be routed from the device to the external leads. Additionally, because the semiconductor device is directly attached to the lead frame, power dissipation, i.e., heat dissipation, is more effectively provided by this direct connection without intervening layers of ceramic or conductor.

15 Claims, 7 Drawing Sheets

LEAD FRAME BASED CERAMIC AIR CAVITY PACKAGE

CROSS REFERENCE TO RELATED APPLICATION

Priority of U.S. Provisional Patent Application Ser. No. 61/226,413, filed Jul. 17, 2009, for "Lead Frame Based Ceramic Air Cavity Package" is claimed.

STATEMENT REGARDING FEDERALLY SPONSORED RESEARCH OR DEVELOPMENT

N/A

BACKGROUND OF THE INVENTION

Semiconductor device packages are known and available in different sizes and configurations to address issues of, for example, power dissipation and operating frequency. Ceramic packages are known but the thermal resistance through these types of packages is often too high to conduct heat dissipated by the device in a sufficient manner to avoid excessive temperature rise and a subsequent decrease in the reliability of the semiconductor device. In a conventional ceramic package, a ceramic base is provided having a conductive area on the inside base surface on which a semiconductor device is mounted and having vias therethrough that contact a heat sink on the outer bottom of the base. The thermal paths are provided through the vias and through the ceramic base material itself.

Mounting the semiconductor device directly to the lead frame provides a low thermal resistance path to remove heat dissipated by the device from the package. Direct mounting of a semiconductor on a lead frame is known in injection molded plastic packages. In such plastic packages, however, the plastic completely fills the space surrounding the semiconductor device. For high frequency applications, the electromagnetic characteristics of the plastic typically detune and degrade the performance of the device embedded in the plastic. In addition, some semiconductor devices have delicate structures on the surface that can be destroyed during the molding process.

What is needed is a semiconductor package that allows high power and high frequency semiconductor devices to operate effectively.

BRIEF SUMMARY OF THE INVENTION

One embodiment of a ceramic semiconductor package according to the invention provides for surface mounting on a printed circuit board or other mounting surface. A ceramic frame is directly attached to a lead frame to define a cavity in which the base of a semiconductor device is mounted to the portion of the lead frame exposed at the bottom of the cavity. Terminals of the semiconductor device are attached to electrical contacts on the ceramic frame inside the cavity. The ceramic package thus provides a hermetic insulated path through which the signals can be routed from the device to the external leads. Additionally, because the semiconductor device is directly attached to the lead frame, power dissipation, i.e., heat dissipation, is more effectively provided by this direct connection without intervening layers of ceramic or conductor as in conventional packages.

BRIEF DESCRIPTION OF THE SEVERAL VIEWS OF THE DRAWINGS

Various aspects of at least one embodiment of the present invention are discussed below with reference to the accompanying figures. It will be appreciated that for simplicity and clarity of illustration, elements shown in the drawings have not necessarily been drawn accurately or to scale. For example, the dimensions of some of the elements may be exaggerated relative to other elements for clarity or several physical components may be included in one functional block or element. Further, where considered appropriate, reference numerals may be repeated among the drawings to indicate corresponding or analogous elements. For purposes of clarity, however, not every component may be labeled in every drawing. These figures are provided for the purposes of illustration and explanation and are not intended as a definition of the limits of the invention. In the figures.

DETAILED DESCRIPTION OF THE INVENTION

This application claims priority under 35 U.S.C. §119(e) to U.S. Provisional Patent Application No. 61/226,413 for "Lead Frame Based Ceramic Air Cavity Package," filed Jul. 17, 2009, the entire disclosure of which is hereby incorporated by reference herein for all purposes.

Figure 1:
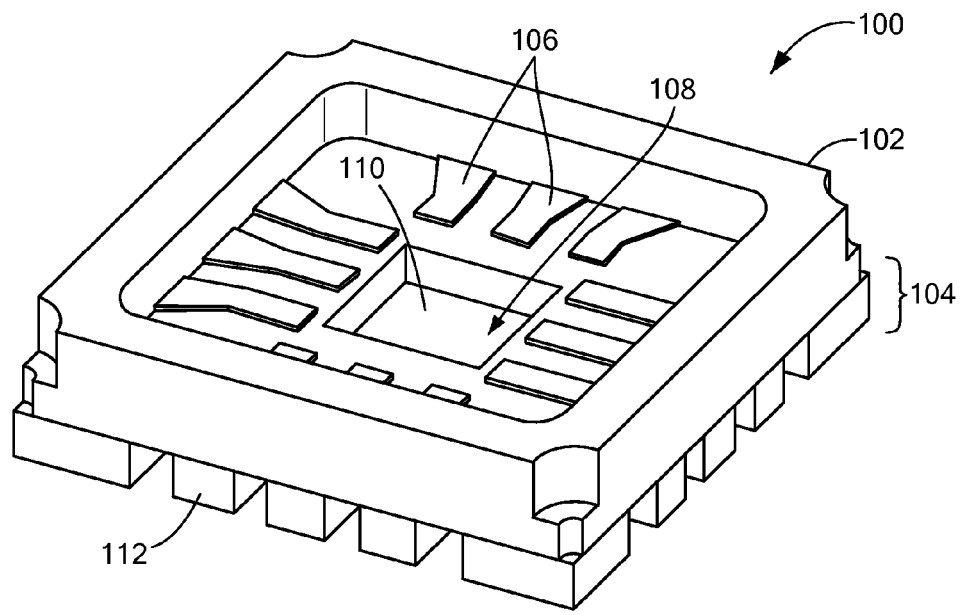
FIG. 1 is a perspective drawing of a top view of an air cavity package in accordance with one embodiment of the present invention.

An air cavity package 100 for housing a semiconductor or other electronic or electrical device or circuit comprises a ceramic portion 102 attached to a lead portion 104, as shown in FIG. 1. The lead portion 104, which is typically copper, but can be made from any one or more other known electrically conductive materials, e.g., copper or copper alloy, is attached to the ceramic portion 102 as will be described below. The ceramic portion 102 comprises an alumina ceramic material.

The ceramic frame 102 comprises a plurality of conductive traces 106 that are, in one embodiment, screened onto the ceramic frame 102 in accordance with known processes. A cavity or opening 108 is defined in the ceramic frame 102 and in which a semiconductor device or circuit (not shown) may be disposed or positioned. The semiconductor or other device or circuit is mounted in the cavity 108 directly on, i.e., in contact with, a central portion 110 of the lead portion 104. Wire bonding is used to couple the device to respective conductive traces 106 and each conductive trace 106 is coupled to a lead 112 of the lead portion 104. After mounting of the semiconductor device in the cavity 108, the package 100 is sealed by attachment of an appropriate lid (also not shown).

The cavity package 100 is particularly suitable for high frequency applications and applications requiring high thermal dissipation, i.e., high-power devices such as power amplifiers, microwave devices, RF power generators, etc., on the order of 8-50 Watts and up to 50 Gigahertz in a package with dimensions of 3 mm on a side.

Figure 2:
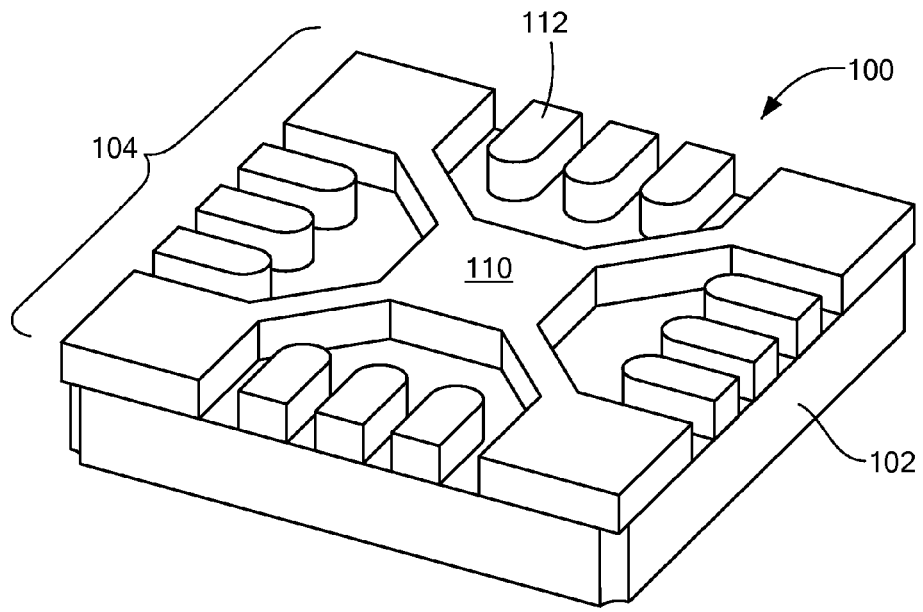
FIG. 2 is a perspective drawing of a bottom view of the air cavity package of FIG. 1.

As shown in FIG. 2, a view of the air cavity package 100 from below, the lead portion 104 includes the central portion 110 and the leads 112. In one embodiment, as shown, the package is a QFN (Quad Flat No Leads) package for surface mounting on a printed circuit board or other mounting surface.

Figure 3:
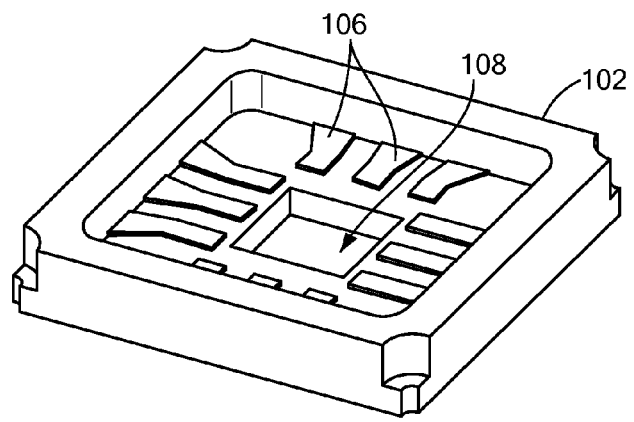
FIG. 3 is a perspective drawing of a ceramic frame of the air cavity package of FIG. 1.
Figure 4:
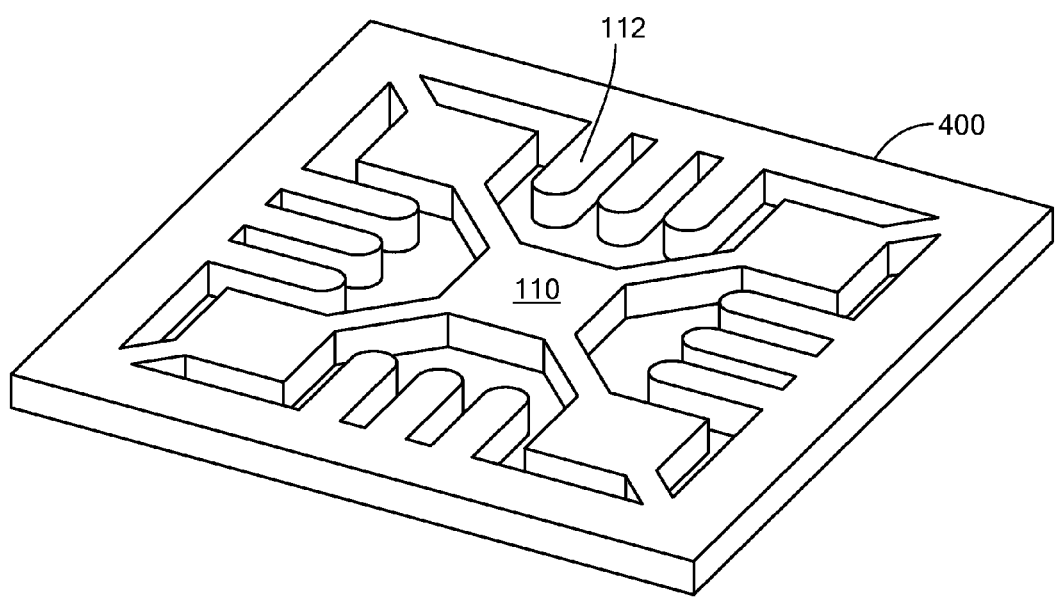
FIG. 4 is a perspective drawing of a lead frame used in making the air cavity package of FIG. 1.
Figure 5:
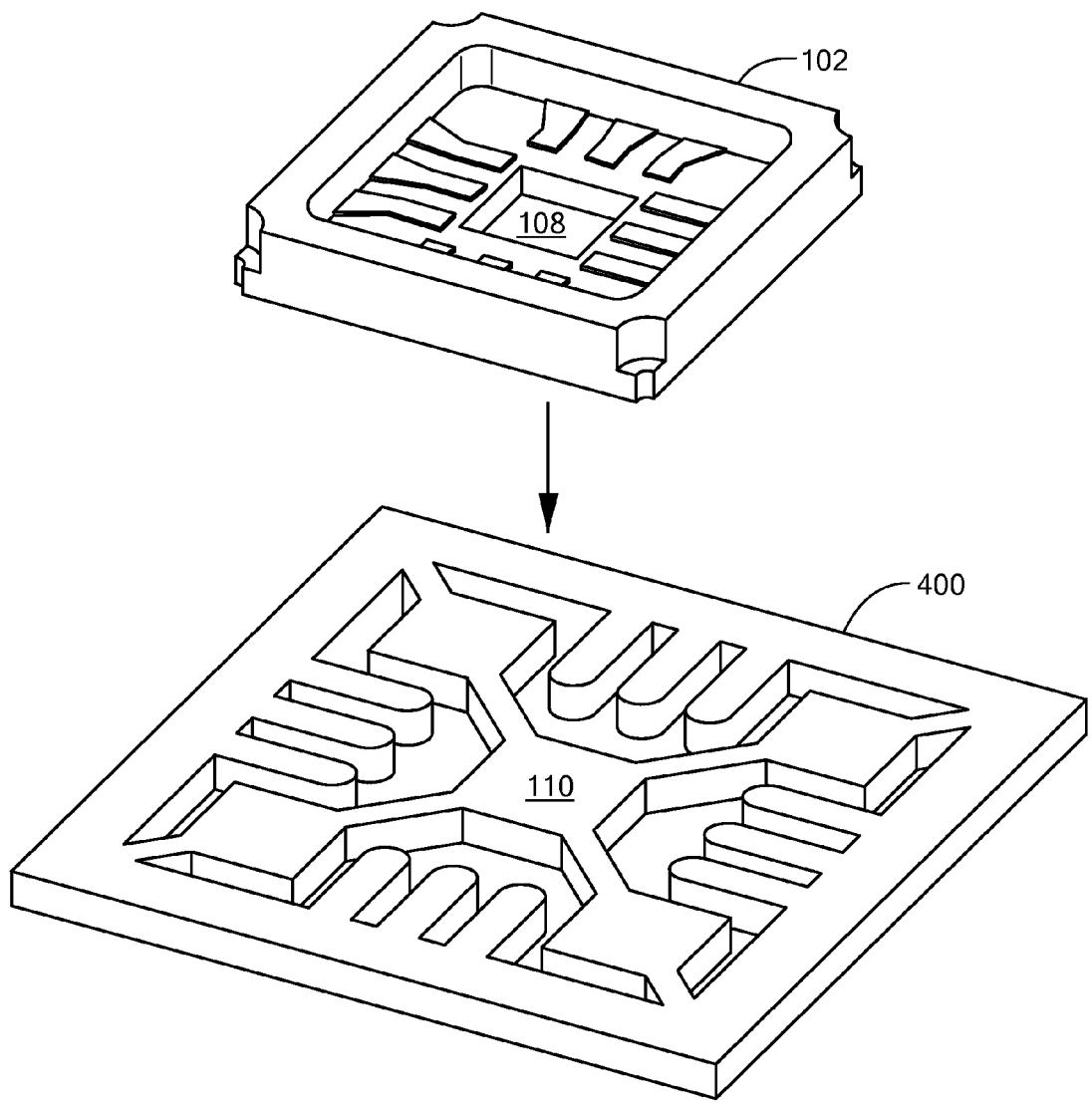
FIG. 5 is a perspective drawing of the ceramic frame of FIG. 3 oriented with respect to the lead frame of FIG. 4 used in making the air cavity package of FIG. 1.

To make the air cavity package 100, the ceramic frame 102, shown by itself in FIG. 3, is directly attached by a brazing operation to a lead frame 400, refer to FIG. 4, that carries the resulting lead portion 104 as will be understood from the description to follow. The ceramic frame 102 is attached to the lead frame 400 such that the cavity 108 is positioned over the central portion 110 of the lead frame 400 as shown in FIG. 5. The lead frame 400 may be comprised of Copper or Copper alloy and can be 0.004 inches or thicker depending upon the needs of the intended application or device to be inserted. Further, the lead frame 400 may be gold-nickel plated as known in the art.

Figure 6A:
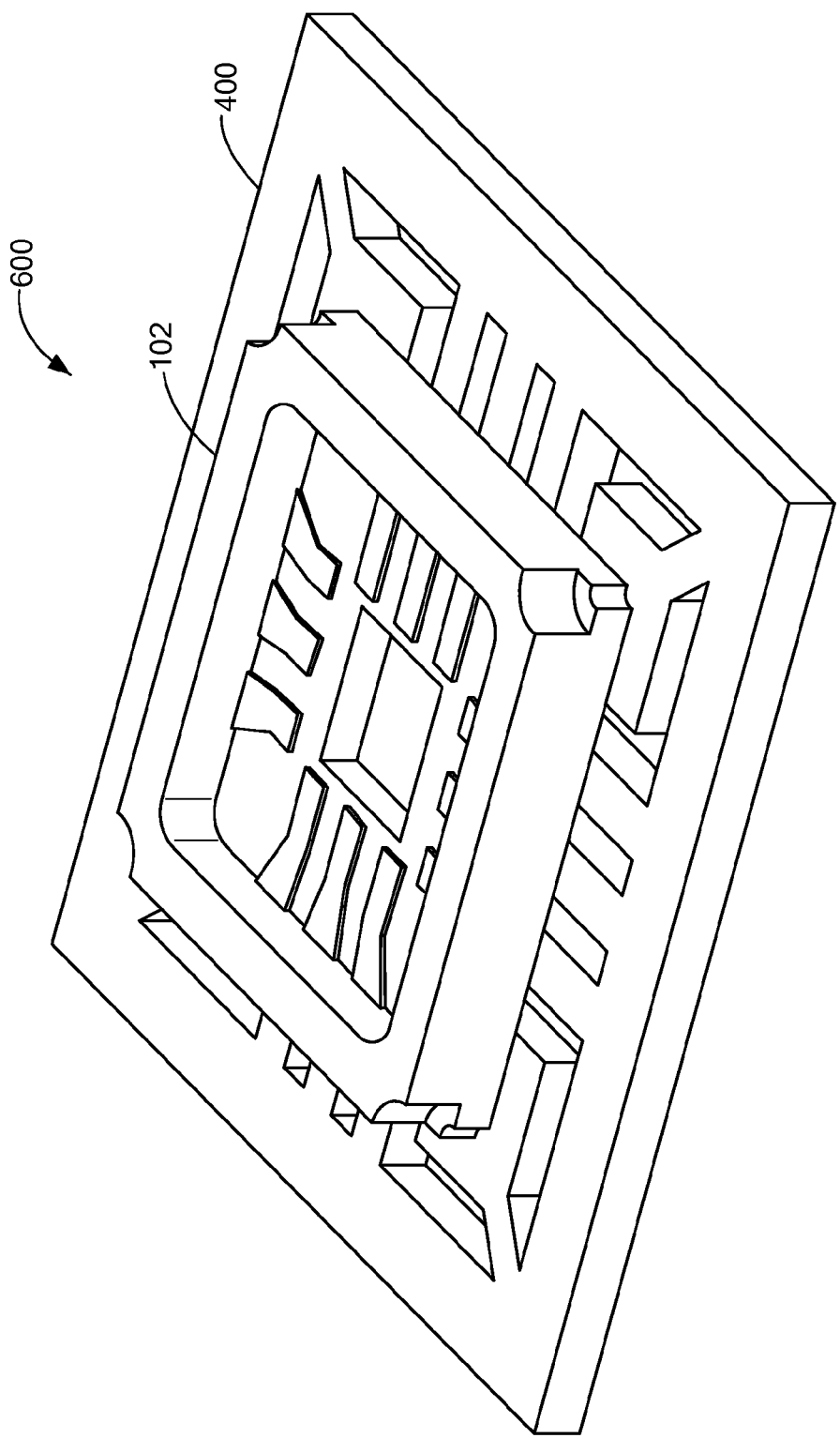
FIGS. 6A-6C are perspective drawings representing the trimming of the assembly of the ceramic frame and lead frame into the air cavity package.
Figure 6B:
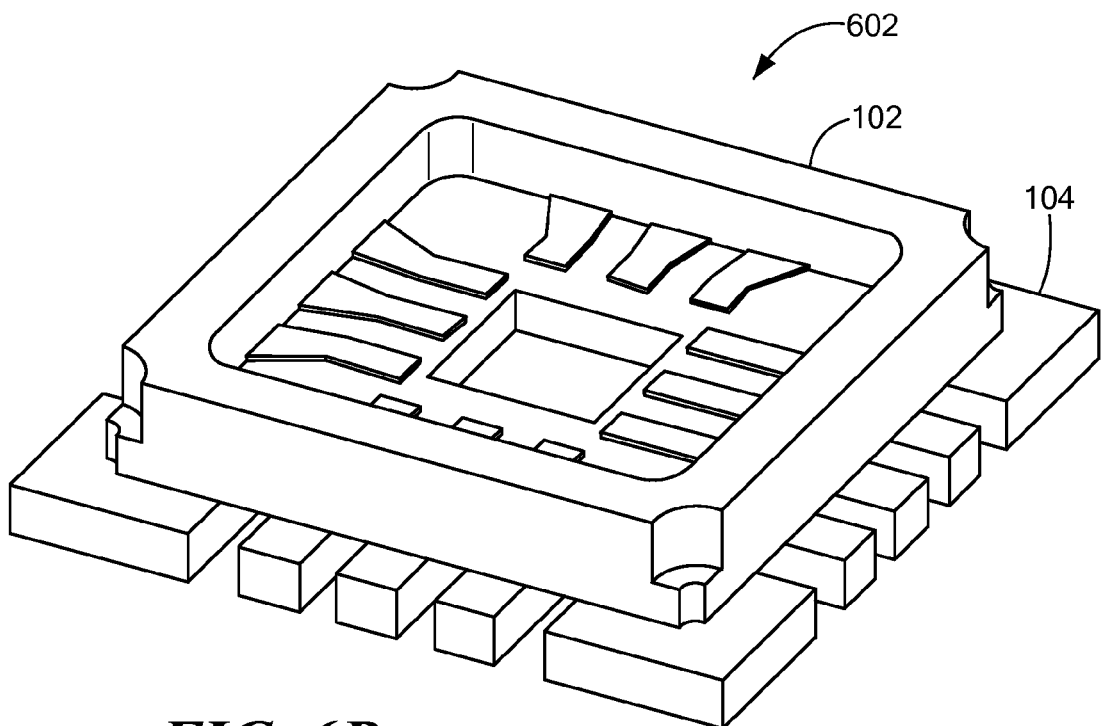
Figure 6C:
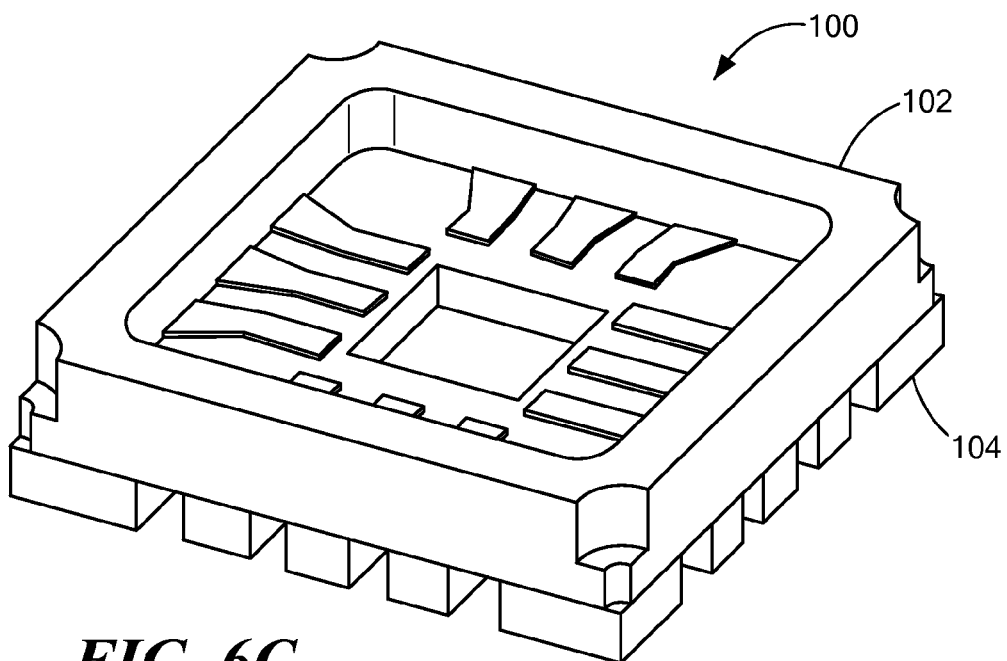

Once the ceramic frame 102 and the lead frame 400 are attached to each other, an intermediate assembly 600, as shown in FIG. 6A results. As shown in FIG. 6A, the leads 112 of the lead frame 400 are still connected to one another and thus not isolated. A cutting step is implemented to trim the carrier portion of the lead frame 400 in order to isolate the leads 112. A first cutting step may result in a second intermediate assembly 602, as in FIG. 6B, where the lead portion 104 and its leads 112 extend beyond the edges of the ceramic frame 102. A subsequent trimming operation may result in the lead frame 400 being cut flush with the edge of the ceramic frame 102 as shown in FIG. 6C and in FIG. 1.

Figure 7:
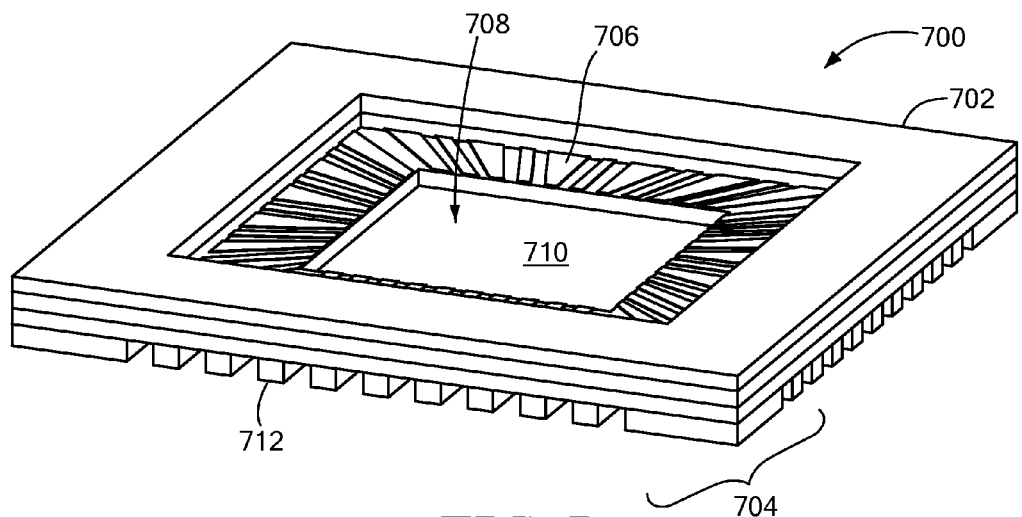
FIG. 7 is a perspective drawing of a top view of an air cavity package in accordance with another embodiment of the present invention.
Figure 8:
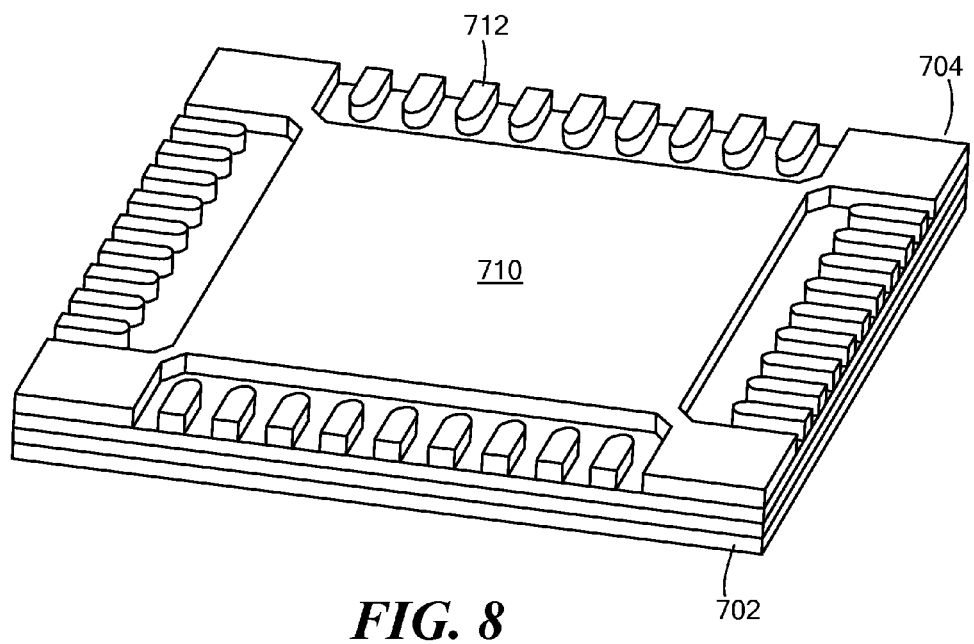
FIG. 8 is a perspective drawing of a bottom view of the air cavity package of FIG. 7.

The size of the air cavity package in accordance with embodiments of the present invention may be altered to accommodate design requirements and includes changing the size of the cavity, the number of traces and the number of leads. Thus, as shown in FIGS. 7 and 8, another air cavity package 700 for housing a semiconductor or other electronic or electrical device or circuit comprises a ceramic portion 702 attached to a lead portion 704 with a greater number of leads than that of the air cavity package 100 shown in FIG. 1. As above, the lead portion 704 may be copper or copper alloy, but can be made from any one or more other known electrically conductive materials.

The ceramic frame 702 has a larger number of conductive traces 706 that may be provided by a screening operation. A cavity or opening 708 is defined in the ceramic frame 702 in which a semiconductor device or circuit may be disposed or positioned. The device is mounted in the cavity 708 to be in contact with a central portion 710 of the lead portion 704. As above, wire bonding or another type of connection technology is used to couple the device to a respective conductive trace 706 where each conductive trace 706 is coupled to a lead 712 of the lead portion 704. The package 700 would be sealed as described above with respect to the air cavity package 100. As shown in FIG. 8, a view of the air cavity package 700 from below, the lead portion 704 includes the central portion 710 and the leads 712. The air cavity package 700 would be assembled in a manner similar to that which has been described above and which will be described below in more detail.

Figure 9:
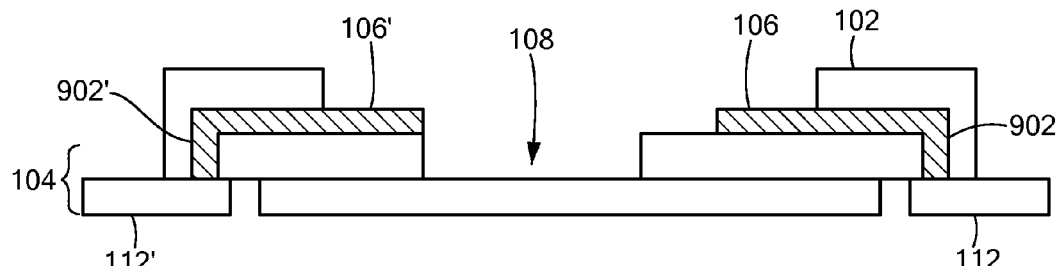
FIG. 9 is a cross-section of the air cavity package shown in FIG. 1.

Referring now to FIG. 9, a cross-sectional view of the air cavity package 100, the cavity 108 is shown between conductive traces 106, 106'. Each conductive trace 106, 106' is coupled to a respective lead 112, 112' by a corresponding via 902, 902' disposed in the ceramic frame 102. Each via 902, 902' is filled with a conductive material such that an electrical signal from the semiconductor device attached to the respective conductive trace 106, 106' will be available at the lead 112, 112'. The conductive traces 106, 106' and the vias 902, 902' are established by processes such as screening or lithography known to those of skill in the art.

The ceramic frame 102 may be made from a plurality of layers of ceramic material connected together to arrive at the desired geometry or shape. These process steps are known to those of skill in the art. Further, conductive layers may be disposed between the layers of ceramic in order to direct signals from one area to another or to connect pads or traces to one another.

Figure 10A:
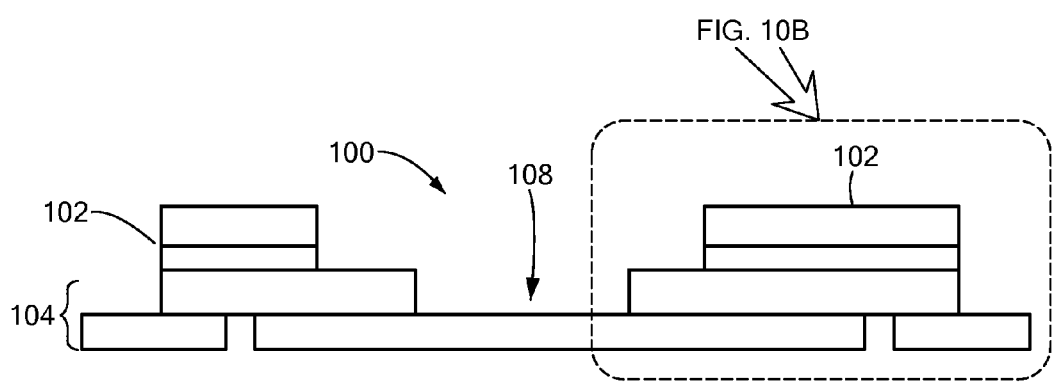
FIGS. 10A and 10B are, respectively, a cross-section and detailed cross-section of the air cavity package shown in FIG. 1.
Figure 10B:
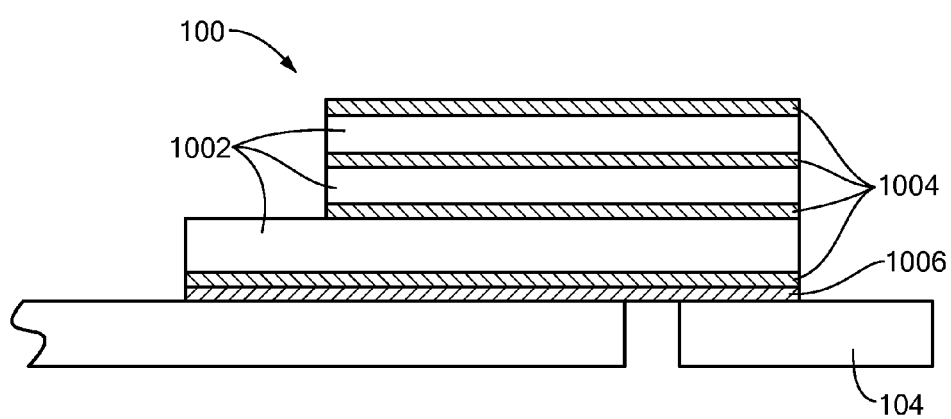

Referring now to FIGS. 10A and 10B, cross-sectional views of the air cavity package 100, the ceramic frame 102 comprises a plurality of ceramic layers 1002 alternating with thick film co-fired conductor layers 1004. Each ceramic layer 1002 may be 0.0004 inches to 0.020 inches in thickness and made from alumina but could be any ceramic having suitable or similar mechanical and electrical characteristics, including, but not limited to, Aluminum Nitride, Beryllium Oxide or Low Temperature Co-Fired Ceramic (LTCC). Each conductor layer 1004 may be 0.0002 inches to 0.0008 inches thick.

A braze material layer 1006, generally 0.001 inches thick, is positioned between the bottom-most conductor layer 1004 and the lead portion 104. The braze material layer 1006 is used to mechanically couple the ceramic frame 102 to the lead frame 400 according to known processes.

In order to accommodate higher frequency devices, the transition from the ceramic frame to the leads is designed to match impedances in accordance with known principles. The number of layers of ceramic material, the thickness of the copper or copper alloy, the dimensions of the traces and the vias, along with grounding considerations, are set depending upon the system requirements. In one non-limiting example, three layers of 0.006 inch tape made from High Temperature Co-Fired Ceramic (HTCC) alumina is used, the copper is 0.010 inches thick, the lines connecting the traces and/or the vias are 0.008 inches on a 0.020 inch pitch and the vias are 0.004 inches in diameter.

The novel package of the present invention avoids the problems of detuning performance by providing an air filled cavity surrounding the device and structured so as to provide sufficient thermal conductivity. In the novel package, the semiconductor device is mounted directly on the central area of the lead frame which operates as a heat sink. There is thus a relatively large area thermally conductive dissipation path to remove heat from the device. Further, the ceramic frame provides a hermetic insulated path through which signals can be routed to and from the device to the external leads.

Having thus described several features of at least one embodiment of the present invention, it is to be appreciated that various other alterations, modifications, and improvements will readily occur to those skilled in the art. Such alterations, modifications, and improvements are intended to be part of this disclosure and are intended to be within the scope of the invention. Accordingly, the foregoing description and drawings are by way of example only, and the scope of the invention should be determined from proper construction of the appended claims, and their equivalents.

What is claimed is:

1. A semiconductor device package comprising:
   a planar lead portion of conductive material having a central area and a plurality of co-planar external leads directed outwardly from the central area;
   a ceramic frame defining a cavity for accepting a semiconductor device; and
   a plurality of conductive traces arranged on the ceramic frame, each conductive trace coupled to a first end of a respective conductive via provided within, and extending through, the ceramic frame and wherein a second end of each conductive via is accessible on a bottom surface of the ceramic frame,
   wherein the bottom surface of the ceramic frame is attached to the lead portion such that the cavity is positioned over the central area of the lead portion and each lead is coupled to the second end of a respective conductive via so as to maintain a hermetic seal about each conductive via.

2. The semiconductor device package of claim 1, wherein the ceramic frame comprises an alumina ceramic material.

3. The semiconductor device package of claim 1, wherein the conductive material of the lead portion comprises copper.

4. The semiconductor device package of claim 3, wherein the conductive material of the lead portion further comprises a copper alloy.

5. The semiconductor device package of claim 1, wherein the conductive traces are provided on the ceramic frame by a screening process.

6. The semiconductor device package of claim 5, wherein each conductive trace is configured to accept a wire bond.

7. The semiconductor device package of claim 1, wherein each conductive via is filled with an electrically conductive material.

8. The semiconductor device package of claim 1, wherein the ceramic frame and the lead portion are coupled to each other by a brazing process.

9. The semiconductor device package of claim 1, wherein the ceramic frame comprises a plurality of ceramic layers disposed upon one another.

10. The semiconductor device package of claim 9, wherein the ceramic frame further comprises a conductive material layer disposed between two of the ceramic layers.

11. The semiconductor device package of claim 9, wherein the ceramic frame further comprises a plurality of layers of conductive materials wherein a layer of conductive material is positioned between each pair of ceramic layers.

12. The semiconductor device package of claim 9, wherein each ceramic layer comprises material chosen from: alumina, Aluminum Nitride, Beryllium Oxide and Low Temperature Co-Fired Ceramic.

13. The semiconductor device package of claim 1, wherein the leads are configured for surface mounting on a printed circuit board.

14. The semiconductor device package of claim 1, wherein each coupling of the lead to the conductive trace is configured to provide impedance matching.

15. The semiconductor device package of claim 14, wherein the impedance matching configuration comprises High Temperature Co-Fired Ceramic alumina.

* * * * *